United States Patent [19]

Pernyeszi

[11] Patent Number: 4,902,901
[45] Date of Patent: Feb. 20, 1990

[54] HIGH-POWER SOLID STATE RELAY EMPLOYING PHOTOSENSITIVE CURRENT AUGMENTING MEANS FOR FASTER TURN-ON TIME

[75] Inventor: Joseph Pernyeszi, Scotts Valley, Calif.

[73] Assignee: Hewlett-Packard Company, Palo Alto, Calif.

[21] Appl. No.: 338,872

[22] Filed: Apr. 14, 1989

[51] Int. Cl.[4] ............................................. G02B 27/00
[52] U.S. Cl. .................................... 250/551; 307/311
[58] Field of Search ......................... 250/551; 307/311

[56] References Cited

U.S. PATENT DOCUMENTS

| | | |
|---|---|---|
| 4,390,790 | 6/1983 | Rodriguez ............................ 250/551 |
| 4,419,586 | 12/1983 | Phipps ................................ 250/551 |
| 4,647,794 | 3/1987 | Guajardo ............................ 307/311 |
| 4,665,316 | 5/1987 | Hodges ............................... 307/311 |
| 4,682,061 | 7/1987 | Donovan ............................ 307/311 |
| 4,754,175 | 6/1988 | Kobayashi et al. ................. 307/311 |

*Primary Examiner*—David C. Nelms
*Assistant Examiner*—Khaled Shami
*Attorney, Agent, or Firm*—Douglas A. Kundrat

[57] ABSTRACT

A high-power solid state relay uses optically-controlled shunt and series solid state switches between a photodiode array and an output device to provide enhanced turn-off and transient immunity characteristics and an optically-controlled charging network connected to the switched load to enhance the turn-on characteristics of the relay.

17 Claims, 1 Drawing Sheet

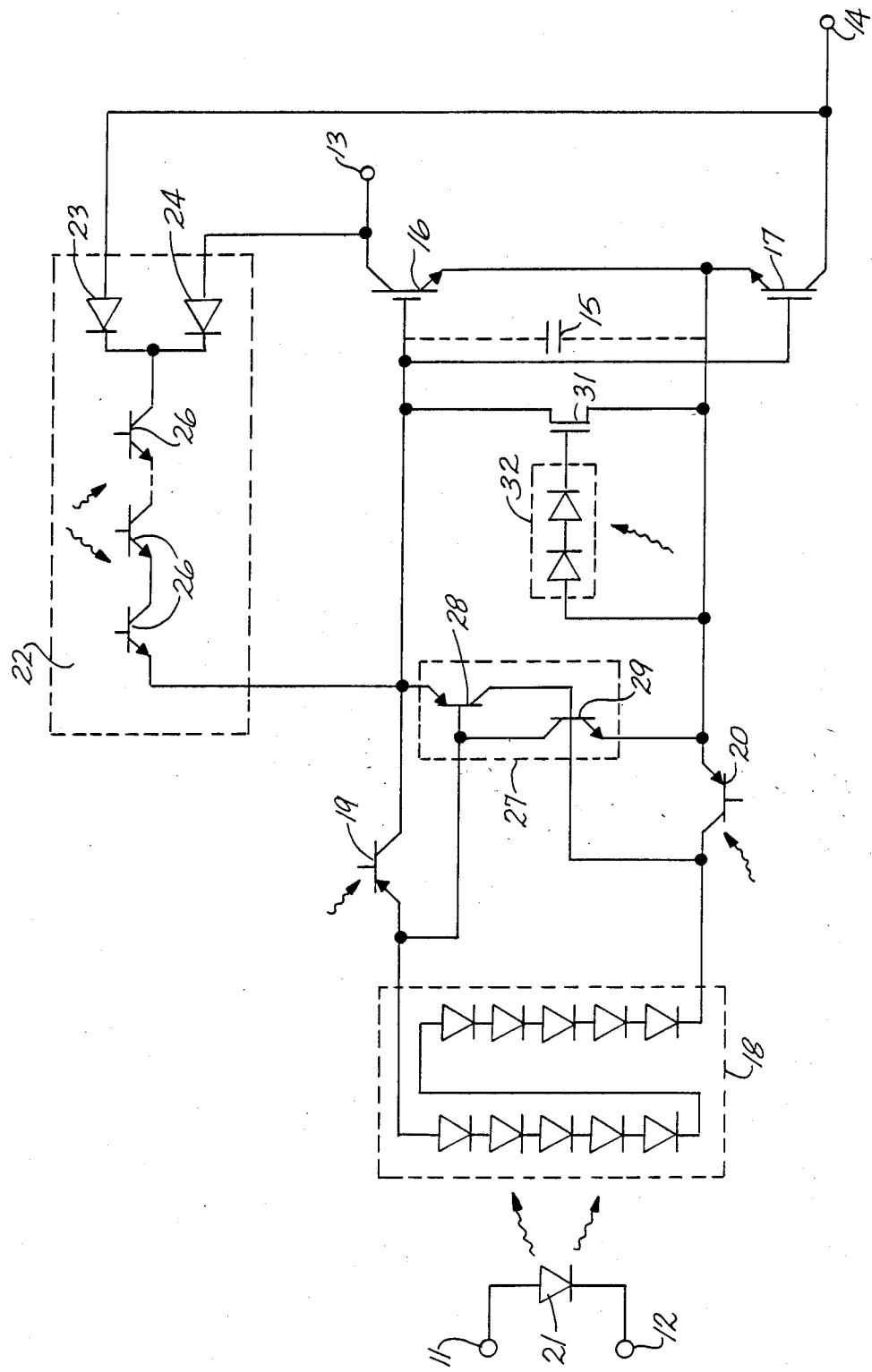

HIGH-POWER SOLID STATE RELAY EMPLOYING PHOTOSENSITIVE CURRENT AUGMENTING MEANS FOR FASTER TURN-ON TIME

FIELD OF THE INVENTION

This invention relates generally to a high-power solid state switch, and, more particularly, to an optically coupled relay for switching high voltages, controllable by a low-voltage control circuit and having enhanced turn-on and turn-off capabilities.

BACKGROUND OF THE INVENTION

A solid state relay provides isolation between a control circuit and a switched circuit and may replace an electromechanical device such as a reed relay. A typical solid state relay consists of a light-emitting diode (LED) optically coupled across an electrically isolating gap to a photovoltaic array. The photodiode array is electrically connected to an output device such as a field effect transistor (FET). Light from the LED creates a voltage across the photovoltaic array and activates the output FET. Alternatively, when light from the LED ceases, the voltage across the photovoltaic array collapses and the output FET is deactivated.

One of the critical limitations of solid state relays is the speed of the switching action. This is the result of a capacitance inherent in the output FET. Each time the photovoltaic array is actuated, this capacitance must be charged before the output FET can turn on. Similarly, each time the photovoltaic array is deactivated, this capacitance must discharge before the output FET can turn off. The charging and discharging of this inherent capacitance inhibits the speed of the switching function. This problem is magnified when high-power circuits must be switched since larger FETs must be used. Accordingly, a larger capacitance must be charged and discharged.

Presently available solid state relays often have relatively slow turn-on and turn-off characteristics and are susceptible to electrical transients. For example, the relay disclosed in U.S. Pat. No. 4,390,790 to Rodriguez includes a photodiode array directly connected to an output FET. Rodriguez's use of a turn-off transistor to discharge the output FET gate-to-source capacitance provides some improvement in turn-off speed, but provides no transient protection to the relay. In a second embodiment disclosed in the Rodriguez patent, an optically coupled JFET switch is used to couple the switched voltage to the gate of the output FET. In so doing, the output FET charges at a faster rate than it normally would. In this set-up, however, the switching JFET suffers from the same draw-backs as the output FET. That is, the JFET has associated with it a charging capacitance which must be overcome. Further, in order for the JFET to switch the current necessary to quickly charge the gate-to-source capacitance of the output FET, the JFET switch must be biased significantly beyond its threshold turn-on voltage. Relays such as this are also vulnerable to transient propagation between the control and switched circuits.

SUMMARY OF THE INVENTION

The present invention provides a solid state relay with improved turn-on and turn-off characteristics and transient immunity. The relay has an LED connectable to a control circuit and a primary photodiode array optically coupled to the LED. A pair of output FETs, which are connectable to a load circuit, are coupled to the primary photodiode array via optically activated isolating phototransistors. Optically-controlled shunt switches are connected to the pair of output FETs to accelerate the discharge of the output FETs inherent capacitance. An optically controlled charging network is connected between the output FETs and the load circuit to increase the turn-on time of the relay. Phototransistors are used to couple and decouple the primary photodiode array from the output FETs at turn-on and turn-of. A shunt FET and a shunt semiconductor-controlled rectifier (SCR) create discharge paths for the output FET gate to source capacitance at turn-off. An array of phototransistors are connected in series to the gate terminal on the output FETs and to the output terminals through blocking diodes. When the relay is turned on, the switched voltage is coupled to the output FETs through the phototransistors, thus providing additional power to charge the output FETs gate-to-source capacitance. When the FET switch is "closed," there is no voltage drop across the switch and no added voltage applied by the photo-transistor array. The switch is kept closed by the primary photodiode array in a conventional manner.

BRIEF DESCRIPTION OF THE DRAWINGS

These and other features and advantages of the present invention will be better understood by reference to the following detailed description when considered in conjunction with the accompanying drawing which is a schematic representation of the preferred embodiment of the present invention.

DETAILED DESCRIPTION OF THE PREFERRED EMBODIMENT

The relay has two input terminals 11 and 12 which are connectable to a low-voltage control circuit and two output terminals 13 and 14 which are connectable to a switched load circuit. One output terminal 13 is connected to the drain terminal of an output field effect transistor (FET) 16, and the other output terminal 14 is connected to the drain terminal of a second output FET 17. The source terminals of each output FET are connected together, as are the gate terminals of each output FET.

In an exemplary embodiment, the output FETs 16 and 17 are vertical double-diffused MOS (DMOS) devices. These FETs are controlled by varying the voltage potential between the gates and sources. For example, the output FETs are turned "on" when the gate-to-source potential is approximately one to two volts or greater. The output FETs are turned "off" when the gate-to-source potential falls below this value. To turn on and off the output FETs, it is necessary to charge and discharge their inherent gate-to-source capacitance 15. When these transistors are "off," they have a very high impedance, and thus act as an open switch in the load circuit. However, when the transistors are "on," a low-impedance path of approximately 200 ohms is provided between the output terminals.

The output FETs are implemented with DMOS devices because of their ability to block high voltages while in an high impedance state. In operation, the output FETs can block voltage in one direction, but can withstand only about one volt in the reverse direction. By connecting the sources of the output FETs 16 and 17 together, one of the FETs is always in the full blocking mode (when they are "off"), and they are able to achieve the desired high, 230 volt, bilateral breakdown voltage despite the existence of parasitic diodes between the sources and drains.

A primary photodiode array 18 is made up of ten individual photodiodes connected together serially anode to cathode. One end of the diode array 18 is coupled to the gates of the output FETs 16 and 17 through an isolation phototransistor 19. The other end of the primary photodiode array is coupled to the sources of the output FETs through a second isolation phototransistor 20. The isolation phototransistors in a preferred embodiment are pnp transistors. It should be understood that npn transistors may also be used to couple the photodiode array to the output FETs. Additionally, since the phototransistors are essentially symmetric and can conduct equally well in the forward and reverse modes, their emitter/collector orientation is not critical. The base electrodes of these devices do not need to be connected since a base/collector current is generated by their photovoltaic activity when illuminated by the control LED.

Turning on the relay is achieved by causing current to flow in a control circuit which, in turn, causes a light emitting diode (LED) 21 to emit light. When the primary photodiode array 18 is illuminated by light from the control LED 21, each of the photodiodes in the array generates approximately a 0.5 volt potential across its terminals, thus creating approximately a five-volt potential across the entire diode array. This potential is coupled to the output FETs through the isolation phototransistors 19 and 20. Illumination of the phototransistors causes the transistors to conduct. The five volts coupled to the output FETs, drives the FETs well into the "on" state once their gate-to-source capacitance is charged.

The turn-on speed of the output FETs is enhanced by the charging network 22. The charging network comprises an array of charging phototransistors 26 and a pair of blocking diodes 23 and 24. The phototransistor array is made up of a number of charging phototransistors connected together serially, the collector electrodes of each phototransistor being connected to the emitter electrodes of an adjacent phototransistor. One end of the phototransistor array is connected to the gates of the output FETs 16 and 17. The other end of the phototransistor array is connected to the anodes of the two blocking diodes 23 and 24. The cathode of one blocking diode 23 is connected to one output terminal 14, and the cathode of the other blocking diode 24 is connected to the other output terminal 13.

The array of charging phototransistors 26 acts like a high current source when coupled to a voltage potential between the output terminals 13 and 14. When the charging phototransistors are activated by light from the LED 21, current is generated by the charging phototransistors in their base-collector junction. This alone provides a small amount of current to the relay. However, when the charging phototransistors are properly biased, this light generated current is amplified by "transistor action" by approximately a factor of the current gain of the phototransistor (beta).

Biasing of the charging phototransistor array 26 is achieved by the coupling of one end of the array of charging phototransistors to the switched voltage in the load circuit. When the relay is open (the output FETs are "off"), a voltage potential appears across the output terminals 13 and 14. Several phototransistors are used to ensure that the bias voltage is adequately divided across each transistor when the relay is used in conjunction with high voltage load circuits.

The blocking diodes 23 and 24 act like a full wave rectifier by coupling the output terminal at the highest potential to the phototransistor array. The voltage at the other output terminal provides a reference voltage for the opposite end of the phototransistor array. It should be understood that regardless of the relative potential between the output terminals, one of the output FETs 16 or 17 is always reverse biased. The voltage on the output terminal corresponding to the reverse biased output FET provides a reference voltage to the gate electrodes of the output FETs through the parasitic diode between the source and drain of that output FET. It should also be understood that the above described biasing will occur when the switch is used with either AC or DC switched load circuits.

Once the output FETs gate-to-source capacitance is adequately charged, the output FETs turn on. When this occurs, the voltage potential across the output drops due to the low impedance path created by the output FETs. In turn, this removes the bias from the phototransistor array, and the charging phototransistors cease current amplification.

The charging phototransistors continue to generate photocurrent since the LED remains lit, however, their effect on the relay is negligible. Once the output FETs are turned on, they are held on by the bias voltage created by the primary photodiode array 18.

This particular architecture provides for a fast turn-on without wasting power from the load circuit. When the LED 21 is turned on, the phototransistor array supplies a relatively large amount of current to the relay for a short period of time. Once the output FETs are turned on, no more power is drained from the load circuit.

Turn-on rise times of 200 microseconds can be achieved with the invention. Without this enhancement, turn-on rise times could be as slow as 100 to 200 milliseconds, depending on the size of the output FETs. Switching speed is important for two reasons. First, the particular application for which the relay is used may require fast switching. Second, slow turn-on, regardless of the application requirement, stresses the FETs by causing them to draw current and thus may cause the FET to overheat.

In order to open the relay switch, the output FETs 16 and 17 must be turned off. This is accomplished by shutting off the LED 21, which causes the voltage potential across the primary photodiode array 18 to collapse towards zero volts. It should be observed, however, that the output FETs will not turn off until their gate-to-source capacitance 15 discharges. In the absence of shunts between the gate and source of the output FETs, this capacitance would have to discharge through stray leakage paths. Since several seconds could be required for discharge in this manner, alternate means for faster turn-off are normally required.

An exemplary embodiment has two optically triggered solid state switches that are open when the output FETs are "on", and that shunt the gate and source terminals of the output FETs when they are turned off. These switches provide a path through which the gate-to-source capacitance of the output FETs can discharge. One of the switches is a silicon controlled rectifier (SCR) 27 comprising transistors 28 and 29. The SCR is connected between the gates and the sources of the output FETs and is controlled by the voltage potential across the primary photodiode array 18. When the primary photodiode array is illuminated, the SCR is held in an open state; however, when the voltage across the primary photodiode array collapses to zero volts, the SCR is triggered and is caused to close. The gates of the output FETs 16 and 17 are also connected to the drain of a discharge junction FET (JFET) 31, while the source of the low current JFET is connected to the sources of the output FETs. The gate of the discharge JFET is connected to one end of a secondary photodiode array 32. The other end of the secondary photodiode array is connected to the sources of the output FETs. The secondary photodiode array comprises two photodiodes connected together serially. When illuminated by the control LED, the secondary photodiode array generates approximately one volt across its ends, which reverse biases the discharge JFET to turn it off. When the voltage across the secondary photodiode array collapses to zero volts, the discharge JFET becomes biased, causing it to turn on and conduct current.

The absence of light also turns off the isolation phototransistors 19 and 20 which, in turn, decouples the primary photodiode array 18 from the output FETs 16 and 17. This step is important as it isolates the primary photodiode array from the output FETs. If this were not the case, the output FETs would try to discharge their gate-to-source capacitance through a reverse biased diode array. This would result in a very slow discharge. Instead, when the diode array is isolated from the output FETs, the SCR 27 is triggered and provides a discharge path between the gate and source.

Two shunt switches are used to discharge the output FET gate-to-source capacitance because each of the switches react differently. The SCR triggers very quickly and it can switch a large level of current in a short time; however, it can only discharge the output FET capacitance to about 0.8 volts due to the bipolar transistor junctions in the switch. Discharge to zero volts, or near zero volts is important because even when the output FETs are biased below their turn-on threshold voltage, the drain-to-source impedance remains dependent upon the gate-to-source voltage. The discharge JFET 31 is used to bring down the gate-to-source potential on the output FETs to near zero volts. The discharge JFET has a slow turn-on time and low current conduction capability relative to the SCR.

The relay also provides protection from transients in the control circuit. The pnp isolation phototransistors 19 and 20 are symmetric and conduct equally well in the forward and reverse modes so that they continue to hold the SCR off, even in the presence of input transients.

The entire circuit, except for the LED 21, is fabricated as one integrated circuit on a single silicon chip. Known dielectric isolation techniques, described in U.S. Pat. No. 4,390,790 to Rodriguez are used to provide necessary electrical isolation between various components of the circuit. The LED can be placed face-to-face with the silicon chip across an isolating gap, or alternatively the LED can be placed in the same plane as the chip. With the latter placement a curved refractive film is positioned over the LED and the silicon chip containing the solid state relay circuity as disclosed by Rodriguez. The face-to-face alignment allows maximum optical coupling between the LED and the relay while providing minimum LED drive current. However, it also increases the undesirable effect of capacitive coupling between the LED and the solid state devices in the relay, thereby increasing the relay's susceptibility to false turn-off due to transients in the control circuit.

The preceding description has been presented with reference to the presently preferred embodiment to the invention shown in the drawings. Workers skilled in the art and technology to which this invention pertains will appreciate that alterations and changes in the described structures can be practiced without departing from the spirit, principles and scope of this invention.

For example, it is apparent that other means for implementing the coupling and discharge network can be used. Means to shunt the gates and sources of the output FETs upon switch turn-off can be implemented with resistive shunts or bipolar transistors. It is also apparent that other photovoltaic devices can be used in place of the diode arrays described herein.

Accordingly, the foregoing description should not be read as pertaining only to the precise structure described, but rather should be read consistent with, and as support for, the following claims which are to have their fullest, fair scope.

What is claimed is:

1. A solid state relay comprising:
   a semiconductor switch having an output;
   a photovoltaic array for maintaining the switch in its on-state when illuminated;
   photoresponsive means for augmenting current from the photovoltaic array with current from the switch output only during initial illumination of the photovoltaic array; and
   illumination means for illuminating both the photovoltaic array and the photoresponsive augmentation means.

2. A solid state relay as recited in claim 1 wherein the photoresponsive augmentation means comprises a plurality of phototransistors.

3. A solid state relay responsive to light comprising:
   a photodiode array for generating a voltage when illuminated;
   a solid state switch responsive to the photodiode array voltage for switching an output voltage, the solid state switch having an inherent input capacitance;
   photoresponsive series switch means for coupling and decoupling the solid state switch to the photodiode array in response to light; and
   current generator means coupled to the solid state switch the current generator means producing a photocurrent in response to light for charging the inherent capacitance, the current generator means further comprising amplification means for amplifying the photocurrent.

4. A solid state relay as recited in claim 3 wherein the amplification means amplifies the photocurrent only while the solid state switch is in an off-state.

5. A solid state relay as recited in claim 4 wherein the current generator means comprises a plurality of phototransistors; the phototransistors being biased by a output across the output of the solid state switch.

6. A solid state relay as recited in claim 3 wherein the solid state switch comprises a field effect transistor (FET).

7. A solid state relay as recited in claim 6 wherein the current generator means comprises a plurality of phototransistors connected between the gate and drain of the output FET.

8. A solid state relay as recited in claim 3 wherein the solid state switch comprises first and second output field effect transistors (FETs) connected gate to gate and source to source, the drains of each FET being connectable to an output voltage.

9. A solid state relay as recited in claim 8 wherein the current generator means comprises an array of phototransistors connected between the gates and the drains of the output FETs.

10. A solid state relay as recited in claim 9 wherein the current generator means further comprises rectifying means coupling the phototransistor array to the drains of the output FETs.

11. A solid state relay comprising:
a semiconductor switch for switching a voltage and having a control terminal and an inherent input capacitance;
a photovoltaic array coupled to the switch for closing the switch upon illumination of the photovoltaic array;
shorting means coupled to the switch for accelerating discharge of the inherent capacitance when illumination of the photovoltaic array is discontinued;
charging means for accelerating the charging of the inherent capacitance upon illumination of the photovoltaic array comprising phototransistor means for coupling the switched voltage to the control terminal of the switch; and
illumination means for simultaneously illuminating the photovoltaic array and the phototransistor means.

12. A solid state relay comprising:
a solid state light emitter;
a solid state photodetector optically coupled to the light emitter;
a variable impedance solid state switch having a control input coupled to the solid state photodetector and being connectable to a switched load circuit, the solid state switch providing a low impedance path in the switched load circuit while in an on-state and a high impedance path while in an off-state;
a solid state current generator having a drain and a source, the source being coupled to the control input of the variable impedance solid state switch and the drain being coupled to the switched load circuit.

13. A solid state relay as recited in claim 12 wherein the solid state current generator is light sensitive and is optically coupled to the solid state light emitter.

14. A solid state relay as in claim 13 wherein the solid state current generator comprises a phototransistor array biased by the voltage in the switched load circuit across the solid state variable impedance switch.

15. A solid state relay as in claim 14 wherein the solid state current generator further comprises a voltage rectifier coupled between the phototransistor array and the switched load circuit across the solid state variable impedance switch for coupling the highest voltage potential across the variable impedance switch to the phototransistor array.

16. A solid state relay as in claim 12 further comprising series switch means controllable by light and optically coupled to the light emitting means, the series switch means being connected between the solid state photodetector and the control input of the solid state variable impedence switch for selectably coupling or decoupling the photodetector to the variable impedence switch.

17. A solid state relay comprising:
a light emitting diode connectable to a control circuit;
a primary photodiode array optically coupled to the light emitting diode and having first and second terminals, the primary photodiode array having a voltage potential generated across the first and second terminals in response to illumination from the light emitting diode such that the first terminal provides a higher voltage relative to the second terminal;
a secondary photodiode array optically coupled to the light emitting diode and having first and second terminals, the secondary photodiode array having a voltage potential generated across the first and second terminals in response to illumination from the light emitting diode such that the first terminal provides a higher voltage relative to the second terminal;
a first output double diffused MOS (DMOS) junction field effect transistor (JFET) connectable to a load circuit having gate, source and drain electrodes;
a second output double diffused MOS (DMOS) junction field effect transistor (JFET) connectable to a load circuit having gate, source and drain electrodes, the gate being connected to the gate electrode of the first output transistor, the source being connected to the source electrode of the first output transistor;
a first pnp phototransistor optically coupled to the light emitting diode and having base, emitter and collector electrodes, the collector being connected to the gate eletrodes of the first and second output transistors and the emitter being connected to the first terminal of the primary photodiode array;
a second pnp phototransistor optically coupled to the light emitting diode and having base, emitter and collector electrodes, the emitter being connected to the source electrodes of the first and second output transistors and the collector being connected to the second terminal of the photodiode array;
a silicon controlled rectifier (SCR) comprised of a npn bipolar transistor and a pnp bipolar transistor each having base, emitter and collector electrodes, the base of the pnp bipolar transistor being connected to the collector electrode of the npn bipolar transistor and the first terminal of the primary photodiode array, the emitter of the pnp bipolar transistor being connected to the gate electrodes of the first and second output transistors, the base of the npn bipolar transistor being connected to the collector electrode of the pnp bipolar transistor and the second terminal of the primary photodiode array, and the emitter of the npn transistor being connected to the source electrodes of the first and second output transistors;
a junction field effect transistor (JFET) with gate, source and drain electrodes, the drain electrode being connected to the gate electrodes of the first and second output transistors and the source electrode being connected to the sources electrodes of the first and second output transistors;
a first blocking diode having an anode and a cathode, the cathode being connected to the drain electrode of the first output transistor;

a second blocking diode having an anode and a cathode, the cathode being connected to the drain electrode of the second output transistor and the anode being connected to the anode of the first blocking diode; and a phototransistor array optically coupled to the light emitting diode and comprising a plurality of phototransistors connected serially, one end of the array being connected to the gate electrodes of the first and second output transistors, the other end of the array being connected to the anodes of the first and second blocking diodes.

* * * * *